(12) United States Patent
Do et al.

(10) Patent No.: US 8,513,655 B2
(45) Date of Patent: Aug. 20, 2013

(54) ORGANIC LIGHT EMITTING DIODE AND MANUFACTURING METHOD THEREOF

(75) Inventors: Lee Mi Do, Daejeon (KR); Kun Sik Park, Daejeon (KR); Ji Man Park, Daejeon (KR); Dong Pyo Kim, Gwangmyeong (KR); Jin-Yeong Kang, Daejeon (KR); Kyu Ha Baek, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 175 days.

(21) Appl. No.: 12/974,708

(22) Filed: Dec. 21, 2010

(65) Prior Publication Data

US 2011/0147787 A1    Jun. 23, 2011

(30) Foreign Application Priority Data

Dec. 22, 2009 (KR) .......... 10-2009-0128653
Dec. 2, 2010 (KR) .......... 10-2010-0122303

(51) Int. Cl.
*H01J 19/42* (2006.01)

(52) U.S. Cl.
USPC .............. 257/40; 257/E51.019; 313/504

(58) Field of Classification Search
USPC ............ 257/40, 431, E51.019; 313/504, 313/506
See application file for complete search history.

(56) References Cited

U.S. PATENT DOCUMENTS

2002/0196401 A1* 12/2002 Grace et al. ............. 349/158
2008/0054795 A1   3/2008 Ohmi et al.

FOREIGN PATENT DOCUMENTS

| KR | 1020070009967 A | 1/2007 |
| KR | 1020070077216 A | 7/2007 |
| KR | 1020090058156 A | 6/2009 |

* cited by examiner

*Primary Examiner* — Thomas L Dickey

(57) ABSTRACT

An organic light emitting diode (OLED) and a method for manufacturing the same are provided. In the OLED, patterned metal electrodes are positioned on one or more of upper and lower portions of a light emission layer to allow light generated from the light emission layer to emit to an area between the patterned metal electrodes.

15 Claims, 2 Drawing Sheets

ORGANIC LIGHT EMITTING DIODE AND MANUFACTURING METHOD THEREOF

CROSS-REFERENCE TO RELATED APPLICATIONS

This application claims the priority of Korean Patent Application No. 10-2009-0128653 filed on Dec. 22, 2009 and Korean Patent Application No. 10-2010-0122303 filed on Dec. 2, 2010, in the Korean Intellectual Property Office, the disclosure of which is incorporated herein by reference.

BACKGROUND OF THE INVENTION

1. Field of the Invention

The present invention relates to an organic light emitting diode (OLED) and a method for manufacturing the same and, more particularly, to a technique of implementing an OLED by using a patterned metal electrode, rather than using a generally used transparent electrode that requires a complicated manufacturing process and incurs a great amount of costs, to thus simplify the manufacturing process of the OLED and reducing a processing unit cost.

2. Description of the Related Art

FIG. 1 is a sectional view of an OLED according to a related art. The related art OLED 10 is formed by coating a positive electrode 12 on a substrate 11, and sequentially coating a hole transport layer 13 facilitating an injection of holes, an organic light emission layer 14 for a light emission, an electron transport layer 15 facilitating an injection of electrons, a negative electrode 16, and a protection layer 17 for improving the durability of the OLED thereon.

The OLED is classified into a bottom emission type OLED, a top emission type OLED, and a dual-emission type OLED according to the direction in which light is emitted on the basis of both electrodes. For the bottom emission, the positive electrode must be formed as a transparent electrode, for the top emission, the negative electrode must be formed as a transparent electrode, and for the dual-emission, both positive and negative electrodes must be formed as transparent electrodes.

That is, in the related art OLED 10, the electrode positioned in the direction of light emissions to emit light must be necessarily formed as a transparent electrode, which is disadvantageous, in that its manufacturing process is complicated and a great amount of costs are incurred.

SUMMARY OF THE INVENTION

An aspect of the present invention provides an organic light emitting diode (OLED) implemented by using a patterned metal electrode, rather than using a generally used transparent electrode that requires a complicated manufacturing process and incurs a great amount of costs, to thus simplify the manufacturing process of the OLED and reducing a processing unit cost, and a method for manufacturing the OLED.

According to an aspect of the present invention, there is provided an organic light emitting diode (OLED) wherein patterned metal electrodes are positioned on one or more of upper and lower portions of a light emission layer to allow light generated from the light emission layer to be emitted to an area between the patterned metal electrodes.

The patterned metal electrodes may be regularly disposed at pre-set intervals. Light emitted from the light emission layer may be controlled according to the interval between the patterned metal electrodes. The interval between the patterned metal electrodes may range from 0.01 um to 300 um.

An opening having a predetermined shape may be formed between the patterned metal electrodes to allow light emitted from the light emission layer to be transmitted in the shape of the opening.

According to another aspect of the present invention, there is provided an organic light emitting diode (OLED) including: a substrate; a front electrode coated on an upper portion of the substrate; a hole transport layer coated on an upper portion of the front electrode and transporting holes injected from the front electrode; a light emission layer coated on an upper portion of the hole transport layer and emitting light as transported holes and electrons are combined; an electron transport layer coated on an upper portion of the light emission layer and transporting injected electrons to the light emission layer; a rear electrode coated on an upper portion of the electron transport layer and injecting electrons to the electron transport layer, wherein one or more of the front electrode and the rear electrode are formed as patterned metal electrodes to allow light emitted from the light emission layer to be emitted to an area between the patterned metal electrodes.

According to another aspect of the present invention, there is provided a method for manufacturing an organic light emitting diode (OLED), including: forming a front electrode as a patterned metal electrode, on an upper portion of a substrate; forming a hole transport layer for transporting holes injected from the front electrode, on an upper portion of the front electrode; forming a light emission layer emitting light according to the combination of transported holes and electrons, on an upper portion of the hole transport layer; forming an electron transport layer for transporting injected electrons to the light emission layer, on an upper portion of the light emission layer; and forming a rear electrode for injecting electrons to the electron transport layer, on an upper portion of the electron transport layer. The method may further include: forming an opening having a certain shape on the front electrode.

In the forming of the rear electrode, the rear electrode may be formed as a patterned metal electrode, and in this case, an opening having a certain shape may be formed on the rear electrode.

According to another aspect of the present invention, there is provided a method for manufacturing an organic light emitting diode (OLED), including: forming a front electrode on an upper portion of a substrate; forming a hole transport layer, for transporting holes injected from the front electrode, on an upper portion of the front electrode; forming a light emission layer emitting light according to the combination of transported holes and electrons, on an upper portion of the hole transport layer; forming an electron transport layer for transporting injected electrons to the light emission layer, on an upper portion of the light emission layer; and forming a rear electrode as a patterned metal electrode for injecting electrons to the electron transport layer, on an upper portion of the electron transport layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
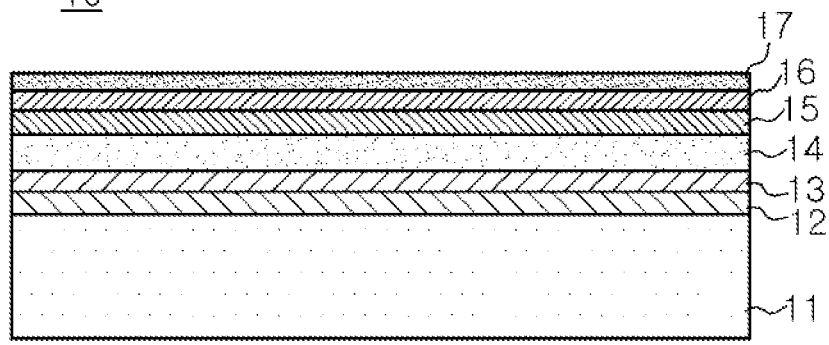
FIG. 1 is a sectional view of an organic light emitting diode (OLED) according to the related art.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

It will be understood that when an element is referred to as being "connected with" another element, it can be directly connected with the other element or intervening elements may also be present. In contrast, when an element is referred to as being "directly connected with" another element, there are no intervening elements present. In addition, unless explicitly described to the contrary, the word "comprise" and variations such as "comprises" or "comprising," will be understood to imply the inclusion of stated elements but not the exclusion of any other elements.

An organic light emitting diode (OLED) according to an exemplary embodiment of the present invention is configured such that patterned metal electrodes, instead of transparent electrodes, are formed on an upper portion, on a lower portion, or on both upper and lower portions of a light emission layer, to allow light generated from the light emission layer to be emitted to an area between the patterned metal electrodes.

Accordingly, the OLED can be implemented as a bottom emission type LED, a top emission type OLED, or a dual-emission type OLED, although it does not use transparent electrodes.

The structure of the OLED according to an exemplary embodiment of the present invention will now be described in detail with reference to FIGS. 2 to 4.

Figure 2:
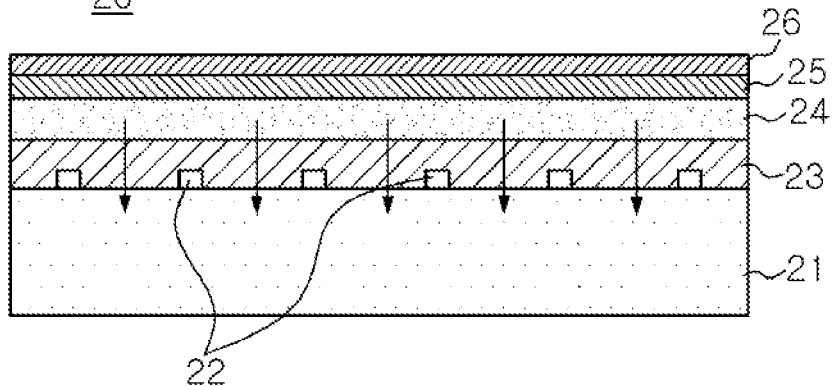
FIG. 2 is a sectional view of an OLED according to an exemplary embodiment of the present invention.

FIG. 2 is a sectional view of an OLED according to an exemplary embodiment of the present invention. An OLED 20 according to an exemplary embodiment of the present invention has a structure in which a substrate 210, patterned metal electrodes 22, a hole transport layer 23, a light emission layer 24, an electron transport layer 25, and a rear electrode 26 are sequentially stacked. In other words, in the OLED 20 according to an exemplary embodiment of the present invention, the patterned metal electrodes 22 are disposed at a lower side of the light emission layer 24. In this case, the substrate 21 must be necessarily formed as a transparent substrate for bottom emission.

The structure of the OLED 20 and its manufacturing process according to an exemplary embodiment of the present invention will now be described in more detail. First, the patterned metal electrodes 22 are formed on the substrate 21. The patterned metal electrodes 22 may be generally used metal electrodes, rather than transparent electrodes. The patterned metal electrodes 22 may be regularly disposed at certain intervals.

Emitted light is controlled according to the interval between the patterned metal electrodes 22, and in this case, the interval may preferably range from 0.1 um to 300 um to maximize a luminous efficiency. In addition, an opening having a linear shape, a circular shape, a quadrangular shape, and the like, may be formed between the patterned metal electrodes 22 to allow light emitted from the light emission layer 24 to be transmitted therethrough in the corresponding linear, circular, quadrangular shape, and the like. Through the foregoing opening, light emitted from the light emission layer 24 may be transmitted as indicated by arrows in FIG. 2.

Thereafter, the hole transport layer 23 is coated on the patterned metal electrodes 22 to transport holes injected from the patterned metal electrodes 22 to the light emission layer. The light emission layer 24, for emitting light, is coated on the hole transport layer 23, and the electron transport layer 25 is coated on the light emission layer 24 to transport electrons injected from the rear electrodes 26 to the light emission layer 24. Subsequently, the rear electrode 26 is coated on the electron transport layer 25. The substrate 21, the hole transport layer 23, the light emission layer 24, the electron transport layer 25, and the rear electrode 26 may be made of the same materials as those of the related art OLED, so a detailed description thereof will be omitted.

Figure 3:
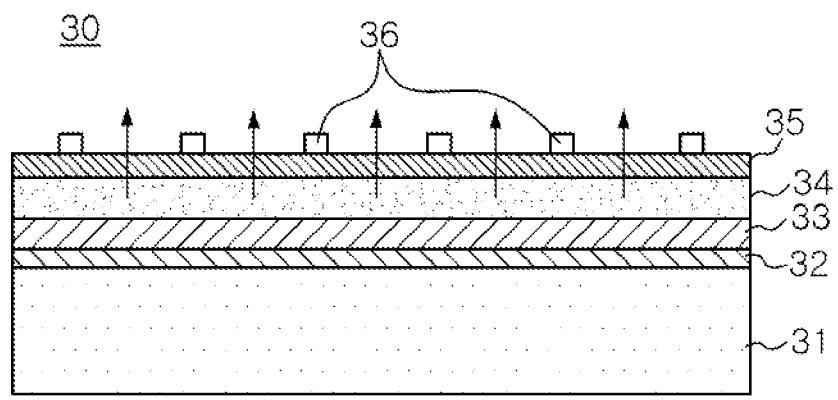
FIG. 3 is a sectional view of an OLED according to another exemplary embodiment of the present invention.

FIG. 3 is a sectional view of an OLED according to another exemplary embodiment of the present invention. An OLED 30 according to the present exemplary embodiment has a structure in which a substrate 31, a front electrode 32, a hole transport layer 33, a light emission layer 34, an electron transport layer 35, and patterned metal electrodes 36 are sequentially stacked. In other words, the OLED 30 according to the present exemplary embodiment is a top emission type OLED in which the patterned metal electrodes 36 are disposed at an upper side of the light emission layer 34. Accordingly, light emitted from the light emission layer 34 can be transmitted through the intervals between the patterned metal electrodes 36 as indicated by arrows in FIG. 3.

The OLED 30 according to the present exemplary embodiment is the same as the OLED 20 illustrated in FIG. 2, except that a positive electrode is formed as a general metal electrode and negative electrodes are formed as the patterned metal electrodes 36, so a detailed description of the respective elements thereof will be omitted.

Figure 4:
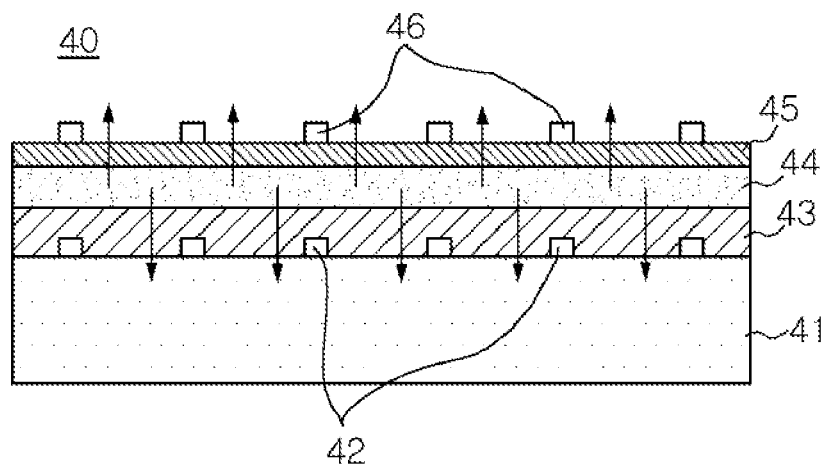
FIG. 4 is a sectional view of an OLED according to another exemplary embodiment of the present invention.

FIG. 4 is a sectional view of an OLED according to another exemplary embodiment of the present invention. An OLED 40 according to the present exemplary embodiment has a structure in which a substrate 41, patterned metal electrodes 42 formed on a front surface, a hole transport layer 43, a light emission layer 44, an electron transport layer 45, and patterned metal electrodes 46 formed on a rear surface are sequentially stacked. In other words, the OLED 40 according to the present exemplary embodiment is a dual-emission type OLED in which the patterned metal electrodes 42 and 46 are disposed on both upper and lower portions of the light emission layer 44. In this case, the substrate 41 must necessarily be made of a transparent material for the purpose of dual-surface light emission. Accordingly, light emitted from the light emission layer 44 can be transmitted through the intervals between the patterned metal electrodes 42 and 46 as indicated by arrows in FIG. 4.

The OLED 40 according to the present exemplary embodiment is the same as the OLED 20 illustrated in FIG. 2, except that both positive and negative electrodes are formed as patterned metal electrodes, so a detailed description of the respective elements thereof will be omitted.

As set forth above, according to exemplary embodiments of the invention, because the OLED is implemented by using patterned metal electrodes, rather than using a generally used transparent electrode that requires a complicated manufacturing process and incurs a great amount of costs, the manufacturing process of the OLED can be simplified a processing unit cost can be reduced.

In addition, the interval between patterned metal electrodes, through which light emitted from the light emission layer passes, can be adjusted to maximize a luminous efficiency (or out-coupling).

While the present invention has been shown and described in connection with the exemplary embodiments, it will be apparent to those skilled in the art that modifications and variations can be made without departing from the spirit and scope of the invention as defined by the appended claims.

What is claimed is:

1. An organic light emitting diode (OLED) comprising a plurality of metal electrodes arranged in a pattern,
   wherein the pattern is provided at any one of a first level and a second level, the first level being disposed over an upper surface of a light emission layer and the second level being disposed below a lower surface of the light emission layer,
   wherein the metal electrodes are separated by an interval therebetween, so that light generated from the light emission layer is transmitted through the interval between the metal electrodes, and
   wherein the plurality of metal electrodes are disposed directly above the upper surface or directly below the lower surface of the light emission layer.

2. The OLED of claim 1, wherein the metal electrodes are regularly disposed at a pre-set interval.

3. The OLED of claim 1, wherein light emitted from the light emission layer is controlled according to the interval between the metal electrodes.

4. The OLED of claim 3, wherein the interval between the metal electrodes ranges from 0.01 µm to 300 µm.

5. The OLED of claim 1, wherein an opening having a predetermined shape is formed between the metal electrodes to allow light emitted from the light emission layer to be transmitted through the shape of the opening.

6. An organic light emitting diode (OLED) comprising:
   a substrate;
   a front electrode pattern disposed on an upper portion of the substrate;
   a hole transport layer coated on an upper portion of the front electrode pattern and configured to transport holes injected from the front electrode pattern;
   a light emission layer coated on an upper portion of the hole transport layer and configured to emit light as a combination of transported holes and electrons;
   an electron transport layer coated on an upper portion of the light emission layer and configured to transport injected electrons to the light emission layer; and
   a rear electrode pattern disposed on an upper portion of the electron transport layer and configured to inject electrons to the electron transport layer,
   wherein at least one of the front electrode pattern and the rear electrode pattern comprises a plurality of metal electrodes, the metal electrodes being separated by an interval therebewteen, so that light emitted from the light emission layer is transmitted through the interval between the metal electrodes, and
   wherein the plurality of metal electrodes are disposed directly above the upper surface or directly below the lower surface of the light emission layer.

7. The OLED of claim 6, wherein the metal electrodes are regularly disposed at a pre-set interval.

8. The OLED of claim 6, wherein light emitted from the light emission layer is controlled according to the interval between the metal electrodes.

9. The OLED of claim 8, wherein the interval between the metal electrodes ranges from 0.01 µm to 300 µm.

10. The OLED of claim 6, wherein an opening having a predetermined shape is formed between the metal electrodes to allow light emitted from the light emission layer to be transmitted through the shape of the opening.

11. A method for manufacturing an organic light emitting diode (OLED), the method comprising:
    forming a front electrode pattern on an upper portion of a substrate;
    forming a hole transport layer on an upper portion of the front electrode pattern, the hole transport layer being configured to transport holes injected from the front electrode pattern;
    forming a light emission layer on an upper portion of the hole transport layer, the light emission layer being configured to emit light as a combination of transported holes and electrons;
    forming an electron transport layer on an upper portion of the light emission layer, the electron transport layer being configured to transport injected electrons to the light emission layer; and
    forming a rear electrode pattern on an upper portion of the electron transport layer, the rear electrode being configured to inject electrons to the electron transport layer,
    wherein the front electrode pattern comprises first and second metal electrodes disposed below a lower portion of the light emission layer, the first and second metal electrodes being separated by a first interval therebetween, and
    wherein the front electrode pattern is disposed directly below a lower surface of the light emission layer and the rear electrode pattern is disposed directly above an upper surface of the light emission layer.

12. The method of claim 11, further comprising:
    forming an opening having a certain shape between the first and second metal electrodes.

13. The method of claim 11, wherein the forming of the rear electrode pattern comprises forming third and fourth metal electrodes disposed over the upper portion of the light emission layer, the third and fourth metal electrodes being separated by a second interval therebetween.

14. The method of claim 13, further comprising:
    forming an opening having a certain shape between the third and fourth metal electrodes.

15. A method for manufacturing an organic light emitting diode (OLED), the method comprising:
    forming a front electrode pattern on an upper portion of a substrate;
    forming a hole transport layer on an upper portion of the front electrode pattern, the hole transport layer being configured to transport holes injected from the front electrode pattern;
    forming a light emission layer on an upper portion of the hole transport layer, the light emission layer being configured to emit light as a combination of transported holes and electrons;
    forming an electron transport layer on an upper portion of the light emission layer, the electron transport layer being configured to transport injected electrons to the light emission layer; and forming a rear electrode pattern on an upper portion of the electron transport layer, the rear electrode pattern being configured to inject electrons to the electron transport layer, wherein the rear electrode pattern comprises first and second metal electrodes disposed over the upper portion of the light emission layer, the first and second metal electrodes being separated by an interval therebetween, and wherein the front electrode pattern is disposed directly below a lower surface of the light emission layer and the rear electrode pattern is disposed directly above an upper surface of the light emission layer.

* * * * *